(12) United States Patent
Priewasser

(10) Patent No.: US 10,991,612 B2
(45) Date of Patent: Apr. 27, 2021

(54) METHOD OF PROCESSING WAFER HAVING PROTRUSIONS ON THE BACK SIDE

(71) Applicant: DISCO Corporation, Tokyo (JP)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 224 days.

(21) Appl. No.: 16/313,738

(22) PCT Filed: Jun. 27, 2017

(86) PCT No.: PCT/EP2017/065825
§ 371 (c)(1),
(2) Date: Dec. 27, 2018

(87) PCT Pub. No.: WO2018/002035
PCT Pub. Date: Jan. 4, 2018

(65) Prior Publication Data
US 2020/0273739 A1    Aug. 27, 2020

(30) Foreign Application Priority Data

Jun. 28, 2016 (GB) ..................................... 1611198

(51) Int. Cl.
 H01L 21/683 (2006.01)
 H01L 21/67 (2006.01)
 H01L 21/78 (2006.01)

(52) U.S. Cl.
CPC .... *H01L 21/6836* (2013.01); *H01L 21/67132* (2013.01); *H01L 21/78* (2013.01); *H01L 2221/68327* (2013.01)

(58) Field of Classification Search
CPC ........... H01L 21/6836; H01L 21/67132; H01L 21/78; H01L 2221/68327; C09J 2203/326
See application file for complete search history.

(56) References Cited

U.S. PATENT DOCUMENTS

2003/0094695 A1   5/2003 Hedler
2005/0106781 A1   5/2005 Ogata
(Continued)

FOREIGN PATENT DOCUMENTS

EP         981156 A2    2/2000
JP       56087341 A     7/1981
(Continued)

OTHER PUBLICATIONS

Int'l. Search report and written opinion issued in Int'l. App. No. PCT/EP2017/065825, dated Mar. 19, 2018.

*Primary Examiner* — Stephen M Bradley
*Assistant Examiner* — Gustavo G Ramallo
(74) *Attorney, Agent, or Firm* — Greer Burns & Crain Ltd.

(57) ABSTRACT

A wafer has a first side with a device area comprising a plurality of devices, and a second side opposite to the first side, wherein the second side has a plurality of protrusions protruding along a thickness direction of the wafer. The wafer is processed by providing a protective film and a base sheet having a cushioning layer applied to a front surface thereof, and attaching a front surface of the protective film to the second side of the wafer. The protective film is adhered to at least a peripheral portion of the second side with an adhesive, and a back surface of the protective film opposite to the front surface thereof is attached to the cushioning layer. The protrusions are embedded in the cushioning layer and a back surface of the base sheet is substantially parallel to the first side of the wafer.

14 Claims, 5 Drawing Sheets

(56) References Cited

U.S. PATENT DOCUMENTS

| | | |
|---|---|---|
| 2005/0142837 A1 | 6/2005 | Tsai et al. |
| 2007/0161139 A1* | 7/2007 | Loeppert ............. B81C 1/00896 |
| | | 438/48 |
| 2008/0242052 A1 | 10/2008 | Feng et al. |
| 2010/0098799 A1* | 4/2010 | Sasaki ................... B29C 59/022 |
| | | 425/174.4 |
| 2010/0193968 A1* | 8/2010 | Takamoto ............. H01L 23/544 |
| | | 257/778 |
| 2010/0193969 A1* | 8/2010 | Takamoto ............. H01L 23/562 |
| | | 257/778 |
| 2011/0281504 A1* | 11/2011 | Omomoto ............... B24B 37/30 |
| | | 451/28 |
| 2012/0322231 A1* | 12/2012 | Kim .................... H01L 21/6836 |
| | | 438/460 |
| 2014/0117504 A1* | 5/2014 | Oliver ................. H01L 21/6835 |
| | | 257/618 |
| 2015/0031215 A1 | 1/2015 | Mahoney et al. |
| 2016/0005634 A1* | 1/2016 | Ishikawa ............... H01L 21/568 |
| | | 438/113 |
| 2017/0062278 A1 | 3/2017 | Priewasser |

FOREIGN PATENT DOCUMENTS

| | | |
|---|---|---|
| JP | 09017756 A | 1/1997 |
| JP | 2000331968 A | 11/2000 |
| JP | 2008098435 A | 4/2008 |
| JP | 2013149901 A | 8/2013 |
| KR | 1020120099765 A | 9/2012 |
| KR | 1020140041338 A | 4/2014 |
| WO | 2017036512 A1 | 3/2017 |

* cited by examiner

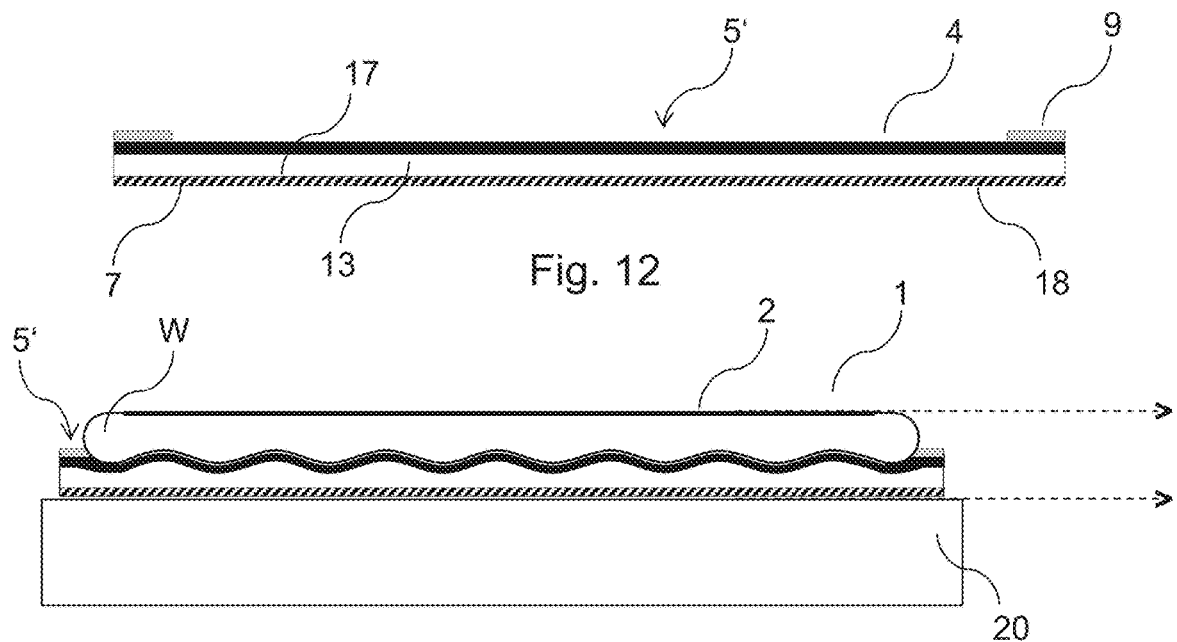
Fig. 12
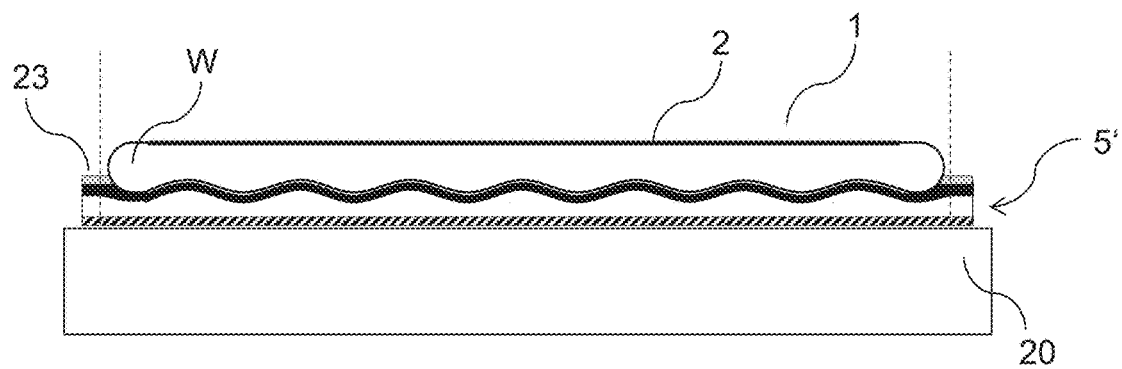
Fig. 13
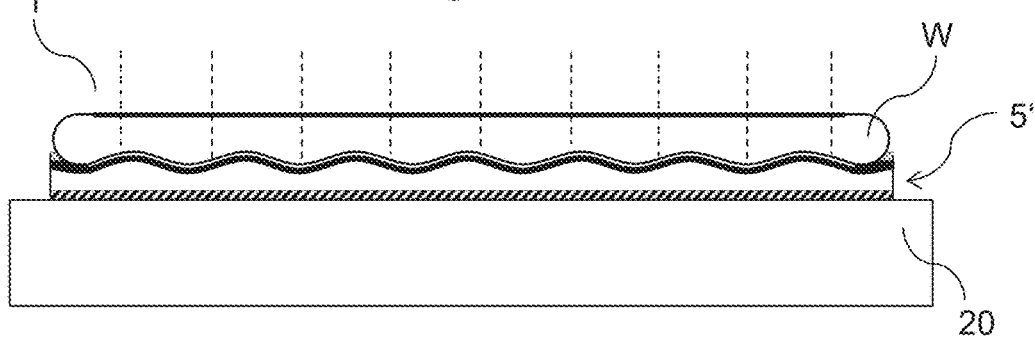
Fig. 14
Fig. 15

METHOD OF PROCESSING WAFER HAVING PROTRUSIONS ON THE BACK SIDE

This is a National Phase Application filed under 35 U.S.C. § 371, of International Application No. PCT/EP2017/065825, filed Jun. 27, 2017, the contents of which are incorporated by reference.

TECHNICAL FIELD

The present invention relates to a method of processing a wafer, such as a semiconductor wafer, having a first side with a device area comprising a plurality of devices, and a second side being opposite to the first side, wherein the second side has a plurality of protrusions protruding along a thickness direction of the wafer.

TECHNICAL BACKGROUND

In a semiconductor device fabrication process, a wafer having a device area which comprises a plurality of devices and is partitioned by a plurality of division lines is divided into individual dies or chips. This fabrication process generally comprises a cutting step of cutting the wafer along the division lines to obtain the individual dies or chips. The cutting step can be performed from a front side of the wafer on which the device area is formed.

In order to obtain high quality dies or chips with well-defined shapes and sizes, this cutting step has to be performed in a precise and reliable manner.

However, in known semiconductor device fabrication processes, problems may arise in the cutting step if protrusions, such as surface unevenness or roughness, bumps, optical elements or the like, protruding along a thickness direction of the wafer are present on a back side of the wafer which is opposite to the wafer front side. Specifically, due to the presence of these protrusions, the risk of breakage of the wafer during cutting is significantly increased.

Moreover, the presence of such protrusions on the wafer back side may cause at least a partial misalignment of the wafer during cutting, adversely affecting the accuracy of the cutting process and, thus, the quality of the resulting dies or chips. In particular, the sidewalls of the dies or chips may crack in the cutting process, thereby severely damaging the dies or chips obtained after cutting.

Hence, there remains a need for a reliable and precise method of processing a wafer having a first side with a device area and a second side with a plurality of protrusions which allows for any risk of damage to the wafer to be minimised.

SUMMARY OF THE INVENTION

Accordingly, it is an object of the present invention to provide a reliable and precise method of processing a wafer having a first side with a device area and a second side with a plurality of protrusions which allows for any risk of damage to the wafer to be minimised. This goal is achieved by a wafer processing method with the technical features of claim 1. Preferred embodiments of the invention follow from the dependent claims.

The invention provides a method of processing a wafer, having a first side with a device area comprising a plurality of devices, and a second side being opposite to the first side, wherein the second side has a plurality of protrusions or projections protruding along a thickness direction of the wafer. The method comprises providing a protective film, providing a base sheet having a cushioning layer applied to a front surface thereof, attaching a front surface of the protective film to the second side of the wafer, wherein the protective film is adhered to at least a peripheral portion of the second side with an adhesive, and attaching a back surface of the protective film opposite to the front surface thereof to the cushioning layer. The protrusions or projections protruding along the thickness direction of the wafer are embedded in the cushioning layer and a back surface of the base sheet opposite to the front surface thereof is substantially parallel to the first side of the wafer. The method further comprises processing the first side of the wafer.

The protrusions or projections, such as surface unevenness or roughness, bumps, optical elements, e.g., optical lenses, other structures or the like, protrude, extend or project from the second side of the wafer along the thickness direction of the wafer. The protrusions or projections define a surface structure or topography of the second side of the wafer, rendering this side uneven.

The protrusions may be irregularly arranged, e.g., in the case of surface unevenness or roughness, or arranged in a regular pattern. Only some of the protrusions may be arranged in a regular pattern.

The protrusions may have any type of shape. For example, some or all of the protrusions may be in the shape of spheres, semi-spheres, pillars or columns, e.g., pillars or columns with a circular, elliptic or polygonal, such as triangular, square etc., cross-section or base area, cones, truncated cones or steps. The protrusions may be irregularly shaped.

At least some of the protrusions may arise from elements formed on the second side of the wafer. At least some of the protrusions may arise from elements partly or entirely penetrating the wafer in its thickness direction, e.g., for the case of a through silicon via (TSV). These latter elements may extend along part of the wafer thickness or along the entire wafer thickness.

The protrusions may have a height in the thickness direction of the wafer in the range of 5 to 300 μm, preferably 10 to 250 μm, more preferably 20 to 200 μm and even more preferably 40 to 150 μm.

All the protrusions may have substantially the same shape and/or size. Alternatively, at least some of the protrusions may differ from each other in shape and/or size.

The first side of the wafer may further have a peripheral marginal area having no devices and being formed around the device area.

The back surface of the protective film is attached to a surface of the cushioning layer which is opposite to the surface of the cushioning layer which is in contact with the base sheet.

According to the wafer processing method of the present invention, the front surface of the protective film is attached to the second side of the wafer, i.e., the wafer back side, and the back surface of the protective film is attached to the cushioning layer applied to the front surface of the base sheet, so that the protrusions on the second side of the wafer are embedded in the cushioning layer and the back surface of the base sheet is substantially parallel to the first side of the wafer. In this way, a wafer unit comprising the wafer, the protective film and the base sheet with the cushioning layer applied thereto is formed, which allows for any negative influence of the surface unevenness arising from the presence of the protrusions on subsequent wafer processing steps to be eliminated.

In particular, by embedding the protrusions in the cushioning layer applied to the front surface of the base sheet, the protrusions, such as for example optical elements or other structures, are reliably protected from any damage during wafer processing, for example, in a subsequent cutting step.

Further, the back surface of the base sheet, which forms a first surface of the wafer unit referred to above, and the first side, i.e., the front side, of the wafer, which forms a second surface of this wafer unit, are substantially parallel to each other. Hence, when cutting the first side of the wafer, a suitable counter pressure can be applied to the back surface of the base sheet, e.g., by placing this back surface on a chuck table.

Since the plane back surface of the base sheet is substantially parallel to the front side of the wafer, a pressure applied to the wafer during the cutting process, e.g., by a cutting or dicing blade of a cutting apparatus, is more evenly and homogenously distributed over the wafer, thus minimising any risk of breakage of the wafer. Further, the substantially parallel alignment of the flat, even back surface of the base sheet and the front side of the wafer allows for the cutting step to be carried out with a high degree of precision, thus achieving the production of high quality dies or chips with well-defined shapes and sizes.

The protective film covers the protrusions formed on the wafer back side, therefore protecting the protrusions from damage and contamination. Moreover, the protective film facilitates removal of the base sheet with the cushioning layer from the wafer after processing. Also, the protective film acts as a further cushion or buffer between the wafer back side and the cushioning layer, thus further contributing to the more uniform and homogeneous distribution of pressure during cutting. Hence, breakage of the wafer during the cutting process can be particularly reliably prevented.

In this regard, it is particularly preferable that the protective film is compressible, elastic, flexible and/or pliable. In this way, the cushioning or buffering effect of the protective film can be further enhanced.

Therefore, the wafer processing method of the present invention allows for the risk of any damage to the wafer, such as wafer breakage, to be minimised in a reliable and efficient way.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

In the method of the invention, the protective film and the base sheet, having the cushioning layer applied to the front surface thereof, may be laminated first, forming a protective sheeting comprising the base sheet, the cushioning layer and the protective film attached to the cushioning layer. The protective sheeting formed in this manner may be subsequently attached to the second side of the wafer, such that the protrusions protruding along the thickness direction of the wafer are covered by the protective film and embedded in the cushioning layer, and the back surface of the base sheet is substantially parallel to the first side of the wafer. In this case, the front surface of the protective film is attached to the second side of the wafer when the protective sheeting is attached to the second side of the wafer.

In this way, the wafer processing method can be carried out in a particularly simple and efficient manner. For example, the protective sheeting can be prepared in advance, stored for later use and used for the wafer processing when required. The protective sheeting may thus be manufactured in large quantities, rendering the production thereof particularly efficient in terms of both time and cost.

Alternatively, the protective film may be attached to the second side of the wafer first, and the second side of the wafer, having the protective film attached thereto, may be subsequently attached to the front surface of the base sheet, so that the protrusions protruding along the thickness direction of the wafer are embedded in the cushioning layer and the back surface of the base sheet is substantially parallel to the first side of the wafer. In this case, the protective film can be attached to the second side of the wafer with a particularly high degree of accuracy, in particular, in relation to the protrusions protruding along the thickness direction of the wafer.

The device area may be partitioned by a plurality of division lines. The step of processing the first side of the wafer may comprise cutting the wafer along the division lines. The wafer may be cut from the first side, i.e., the front side, thereof.

The cutting may be performed by mechanical cutting, e.g., by blade dicing or sawing, and/or by laser cutting and/or by plasma cutting. For example, laser cutting may be carried out by laser ablation or by forming modified layers inside the wafer along the division lines by laser irradiation. The wafer may be cut in a single mechanical cutting step, a single laser cutting step or a single plasma cutting step.

Alternatively, the wafer may be cut by a sequence of mechanical cutting and/or laser cutting and/or plasma cutting steps.

In some embodiments, the first side of the wafer may be partially cut with a first cutting width, e.g., by mechanical cutting, and a remaining part of the wafer, in the thickness direction thereof in the region or regions where the partial cut or cuts had been formed, may be mechanically cut and/or cut by laser and/or cut by plasma from the first side of the wafer with a second cutting width. The second cutting width may be smaller than or equal to the first cutting width. In the step of partially cutting the first side of the wafer, the first side of the wafer is partially cut in the thickness direction of the wafer, i.e., along part of the thickness of the wafer. The method of the invention allows for the cutting process to be performed with a particularly high degree of precision, so that the depth of the partial cut or cuts can be accurately controlled. In particular, since the back surface of the base sheet is substantially parallel to the first side of the wafer, a plurality of partial cuts with uniform depths can be consistently formed along the division lines.

The cutting of the wafer is performed in a state in which the protective film and the base sheet with the cushioning layer are attached to the wafer. In this way, it can be ensured that the pressure applied during the cutting step is uniformly and homogenously distributed throughout the wafer during cutting, thus minimising any risk of damage to the wafer, e.g., cracking of the sidewalls of the resulting dies or chips, in the cutting step. Moreover, the cutting step can be performed with a high degree of accuracy, thus obtaining high quality dies or chips with well-defined shapes and sizes.

The method may further comprise removing the protective film, the cushioning layer and the base sheet from the wafer. For example, the protective film, the cushioning layer and the base sheet may be removed from the wafer after processing, e.g., cutting, the first side of the wafer. In this way, the individual dies or chips can be separated and picked up in a simple and reliable manner. For instance, if the protective film, the cushioning layer and the base sheet are provided in the form of the protective sheeting described above, the protective sheeting may be removed from the wafer after processing, e.g., cutting.

In some embodiments, the base sheet, the cushioning layer and the protective film may be removed individually, i.e., one after the other.

Further, the base sheet and the cushioning layer may be removed together first, followed by the removal of the protective film. In this case, the separated dies or chips can be picked up from the protective film in a particularly simple and efficient manner.

Alternatively, the base sheet may be removed first, followed by removing the cushioning layer and the protective film together.

The processing, e.g., cutting, of the wafer is performed before removing the protective film, the cushioning layer and the base sheet from the wafer. Thus, the wafer is safely protected by the protective film, the cushioning layer and the base sheet in the cutting process. Hence, any damage to the wafer during cutting can be reliably avoided.

The adhesive for adhering the protective film to the second side of the wafer may be provided only in the peripheral portion of the second wafer side, e.g., in a portion of the second wafer side corresponding to the peripheral marginal area formed on the first side of the wafer. By providing the adhesive only in the peripheral portion of the second wafer side, the area in which protective film and wafer are attached to each other is significantly reduced. Thus, the protective film can be detached from the wafer more easily and the risk of damage to the wafer, in particular, the protrusions formed on the second side thereof, is further reduced.

Moreover, if the adhesive is treated, e.g., cured, for allowing easier detachment of the protective film, the devices formed in the device area and/or the protrusions formed on the second side of the wafer can be particularly reliably protected from damage in the treatment process, since they can be located spaced apart from the area where the adhesive is present.

For example, the adhesive may be provided in the peripheral portion of the second wafer side in an annular arrangement.

Alternatively, the adhesive may be provided over an entire contact area of the second side of the wafer and the protective film. In this way, it can be ensured that the protective film is particularly reliably held in place on the second side of the wafer. Further, after cutting of the wafer, the resulting separated chips or dies can be securely held by the protective film, thus preventing any undesired shift or movement of the chips or dies.

In particular, the adhesive may be provided over an entire surface of the protective film which is in contact with the second side of the wafer.

The adhesive may be curable by an external stimulus, such as heat, UV radiation, an electric field and/or a chemical agent. In this way, the protective film can be particularly easily removed from the wafer after processing. The external stimulus may be applied to the adhesive so as to lower the adhesive force thereof, thus allowing for an easy removal of the protective film.

The step of attaching the protective film to the second side of the wafer may be carried out in a vacuum chamber. In particular, the protective film may be attached to the second side, i.e., the back side, of the wafer by using a vacuum laminator. In such a vacuum laminator, the wafer is placed on a chuck table in a vacuum chamber in a state in which the wafer front side is in contact with an upper surface of the chuck table and the wafer back side is oriented upward. The protective film to be attached to the wafer back side is held at its peripheral portion by an annular frame and placed above the wafer back side in the vacuum chamber. An upper part of the vacuum chamber which is situated above the chuck table and the annular frame is provided with an air inlet port closed by an expandable rubber membrane.

After the wafer and the protective film have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective film against the wafer back side, sealing the peripheral wafer portion with the protective film and pressing the film against the wafer back side. Hence, the protective film can be attached closely to the wafer back side, so as to follow the contours of the protrusions formed thereon.

Subsequently, the vacuum in the vacuum chamber is released and the protective film is held in position on the wafer back side by the adhesive and the positive pressure in the vacuum chamber.

Alternatively, the rubber membrane can be replaced by a soft stamp or a soft roller.

The protective film may be attached to the second side of the wafer so that the film only partially follows the contours of the protrusions. For example, the protective film may follow only upper portions of the protrusions in the thickness direction of the wafer. Such an arrangement of the protective film may allow for a particularly easy removal of the base sheet with the cushioning layer applied thereto and the protective film from the wafer.

Alternatively, the protective film may be attached to the second wafer side so as to closely follow the contours of the protrusions. In this way, the protrusions with the protective film attached thereto can be particularly reliably embedded in the cushioning layer.

The protective film may be expandable. The protective film may be expanded when being attached to the second side of the wafer, so as to follow the contours of the protrusions protruding along the thickness direction of the wafer.

In particular, the protective film may be expandable to twice its original size or more, preferably three times its original size or more and more preferably four times its original size or more. In this way, in particular, for the case of an expansion to three or four times its original size or more, it can be reliably ensured that the protective film closely follows the contours of the protrusions.

The cushioning layer may be formed of any type of material which allows for the protrusions protruding along the thickness direction of the wafer to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the processing method of the invention are ResiFlat by the DISCO Corporation and TEMPLOC by DENKA.

The method may further comprise applying the external stimulus to the cushioning layer so as to cure the cushioning layer, before processing, e.g., cutting, the first side of the wafer. In this way, the protection of the wafer during cutting and the cutting accuracy can be further improved.

The protective film facilitates removal of the base sheet with the curable or cured cushioning layer applied thereto from the wafer. In particular, due to the presence of the protective film, the base sheet with the cushioning layer can be removed from the wafer in a reliable and simple manner, avoiding any residues, such as resin, adhesive or gel residues, on the wafer, thus preventing contamination of the chips or dies, and minimising the risk of damaging the protrusions in the removal process.

The base sheet with the cured cushioning layer can be removed after curing in a particularly reliable and efficient manner if the curable cushioning layer exhibits a degree of compressibility, elasticity and/or flexibility, i.e., is compressible, elastic and/or flexible, for example, rubber-like, after curing.

If the cushioning layer is configured so as to reach a rigid, hard state upon curing, removal of the base sheet and the cushioning layer from the wafer may be facilitated by applying an external stimulus to the cured cushioning layer, softening or removing the cushioning layer at least to some extent. For example, some cushioning layers, e.g., formed of the UV curable resin TEMPLOC by DENKA, may be treated by applying hot water thereto after curing, in order to soften the cured cushioning layer and allow for a particularly easy removal of the base sheet and the cushioning layer from the wafer.

The method of the invention may further comprise cutting off a portion or portions of the protective film and/or the cushioning layer, e.g., the curable or cured cushioning layer, and/or the base sheet which laterally extends or extend beyond a circumference of the wafer, before processing, e.g., cutting, the first side of the wafer. In this way, handling of the wafer unit, comprising the wafer, the protective film and the base sheet with the cushioning layer applied thereto, during processing is further facilitated.

The material of the base sheet is not particularly limited. The base sheet may be made of a soft or pliable material, such as, for example, a polymer material, e.g., polyvinyl chloride (PVC), ethylene vinyl acetate (EVA) or polyolefin.

Alternatively, the base sheet may be made of a rigid or hard material, such as PET and/or silicon and/or glass and/or SUS.

For example, if the base sheet is made of PET or glass and the cushioning layer is curable by an external stimulus, the cushioning layer may be cured with radiation that is transmittable through PET or glass, for instance UV radiation. If the base sheet is made of silicon or SUS, a cost-efficient base sheet is provided.

Also, the base sheet may be formed of a combination of the materials listed above.

The base sheet may have a thickness in the range of 200 to 1500 μm, preferably 400 to 1200 μm and more preferably 500 to 1000 μm.

The protective film may have a thickness in the range of 5 to 200 μm, preferably 8 to 100 μm, more preferably 10 to 80 μm and even more preferably 12 to 50 μm. In this way, it can be ensured that the protective film is flexible and pliable enough to sufficiently conform to the contours of the protrusions and, at the same time, exhibits a sufficient thickness in order to reliably and efficiently provide the cushioning or buffering effect described above.

The protective film may be made of a polymer material, such as polyvinyl chloride (PVC), ethylene vinyl acetate (EVA) or polyolefin. For example, the protective film may be a "Saran" wrap-like material.

The diameter of the protective film in the attached state thereof may be approximately the same as the diameter of the wafer.

The cushioning layer may have a thickness in the range of 10 to 300 μm, preferably 20 to 250 μm and more preferably 50 to 200 μm.

BRIEF DESCRIPTION OF THE DRAWINGS

Hereinafter, non-limiting examples of the invention are explained with reference to the drawings, in which:

FIG. 12 is a cross-sectional view showing a second embodiment of a protective sheeting to be used in a method of processing the wafer according to the present invention;

FIG. 13 is a cross-sectional view showing the outcome of a step of attaching the protective sheeting shown in FIG. 12 to a wafer in a method of processing the wafer according to another embodiment of the present invention;

FIG. 14 is a cross-sectional view illustrating a step of cutting off laterally extending portions of the protective sheeting shown in FIG. 13; and FIG. 15 is a cross-sectional view illustrating a cutting step performed on the wafer shown in FIG. 14.

DETAILED DESCRIPTION OF PREFERRED EMBODIMENTS

Preferred embodiments of the present invention will now be described with reference to the accompanying drawings. The preferred embodiments relate to methods for processing a wafer W and to protective sheetings for use in these methods.

The wafer W can be, for example, a MEMS wafer having MEMS devices formed on a front side surface, i.e., a surface of a first side, thereof, which is called a pattern side 1 in the following description. However, the wafer W is not limited to a MEMS wafer, but may also be, for example, a CMOS wafer having CMOS devices, preferably as solid-state imaging devices, formed on the pattern side 1 thereof or a wafer with other types of devices on the pattern side 1.

The wafer W may be made of a semiconductor, e.g., silicon. Such a silicon wafer W can include devices, such as ICs (integrated circuits) and LSIs (large scale integrations), on a silicon substrate. Alternatively, the wafer may be an optical device wafer configured by forming optical devices, such as LEDs (light emitting diodes), on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the μm range, preferably in the range of 625 to 925 μm.

The wafer W preferably exhibits a circular shape. The wafer W is provided with a plurality of crossing division lines 11 (see FIG. 2), called streets, formed on the pattern side 1 thereof, thereby partitioning the wafer W into a plurality of rectangular regions where devices, such as those described previously, are respectively formed. These devices are formed in a device area 2 of the wafer W. In the case of a circular wafer W, this device area 2 is preferably substantially circular and arranged concentrically with the outer circumference of the wafer W.

Figure 1:
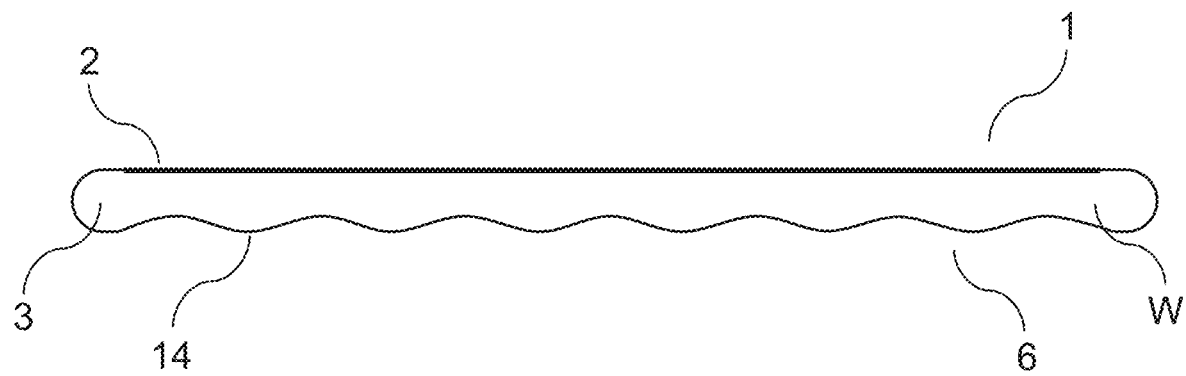
FIG. 1 is a cross-sectional view showing a wafer to be processed by the method of the present invention.
Figure 2:
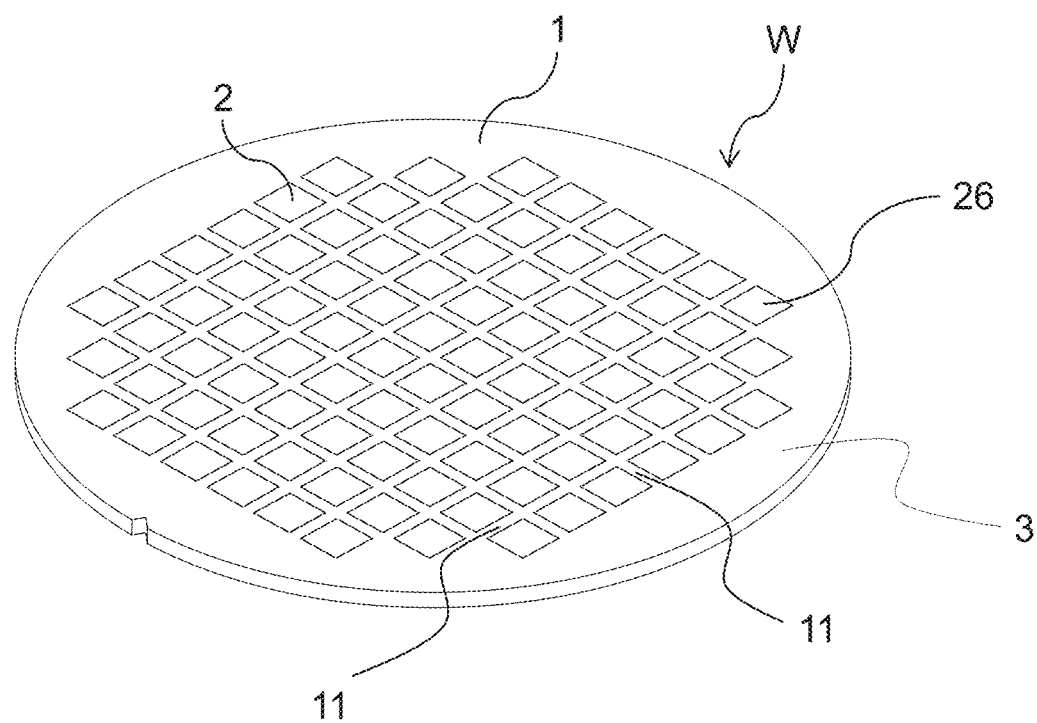
FIG. 2 is a perspective view of the wafer shown in FIG. 1.

The device area 2 is surrounded by an annular peripheral marginal area 3, as is schematically shown in FIGS. 1 and 2. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The wafer W further has a second side 6, i.e., a back side, being opposite to the first side 1 (see FIG. 1). The second side 6 has a plurality of protrusions 14 protruding along a thickness direction of the wafer W, as is schematically shown, for example, in FIG. 1. The protrusions 14 may be, for example, surface unevenness or roughness, bumps, optical elements, e.g., optical lenses, other structures or the like. The height of the protrusions 14 in the thickness direction of the wafer W may be, for example, in the range of 5 to 300 μm. The protrusions 14 illustrated, e.g., in FIG. 1 are not drawn to scale but shown in enlarged form for better presentability.

In the following, a method of processing a wafer W according to a first embodiment of the present invention will be described with reference to FIGS. 1 to 11.

Figure 3:
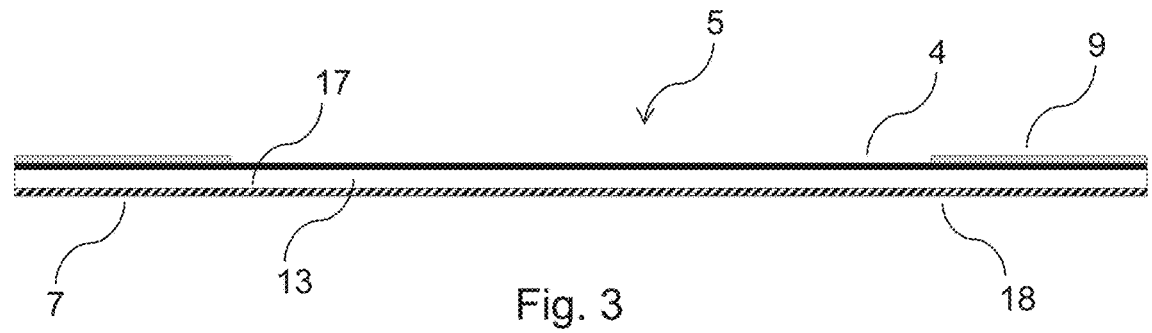
FIG. 3 is a cross-sectional view showing a first embodiment of a protective sheeting to be used in a method of processing the wafer according to the present invention.

FIG. 1 shows a cross-sectional view of the wafer W to be processed by the method of the present invention. FIG. 2 shows a perspective view of the wafer W shown in cross-section in FIG. 1. FIG. 3 shows a cross-sectional view of a protective sheeting 5 according to a first embodiment.

As is shown in FIG. 3, the protective sheeting 5 comprises a base sheet 7, a cushioning layer 13 applied to a front surface 17 of the base sheet 7, a protective film 4, a back surface of which is attached to the cushioning layer 13, and an adhesive layer 9 applied to a part of a front surface of the protective film 4 opposite to the back surface thereof. Specifically, the adhesive layer 9 has an annular shape and is provided in a circumferential or peripheral portion of the front surface of the protective film 4.

Alternatively, the adhesive layer 9 may be provided over an entire contact area of the second side 6 of the wafer W and the protective film 4. In particular, the adhesive layer 9 may be provided over an entire surface of the protective film 4 which is in contact with the second side 6 of the wafer W.

The base sheet 7 and the cushioning layer 13 have a substantially circular shape. The outer diameters of the base sheet 7 and the cushioning layer 13 are substantially identical to each other and to the outer diameter of the adhesive layer 9.

The base sheet 7 may, for example, have a thickness in the range of 500 to 1000 μm. The protective film 4 may have a thickness in the range of 5 to 200 μm. The cushioning layer 13 may have a thickness in the range of 10 to 300 μm, preferably 50 to 200 μm.

The cushioning layer 13 is curable by an external stimulus, such as UV radiation, heat, an electric field and/or a chemical agent. In particular, the cushioning layer 13 may be formed of a curable resin, such as ResiFlat by DISCO Corporation or TEMPLOC by DENKA.

The protective sheeting 5 is formed by laminating the protective film 4 and the base sheet 7 having the cushioning layer 13 applied to the front surface 17 thereof.

Figure 4:
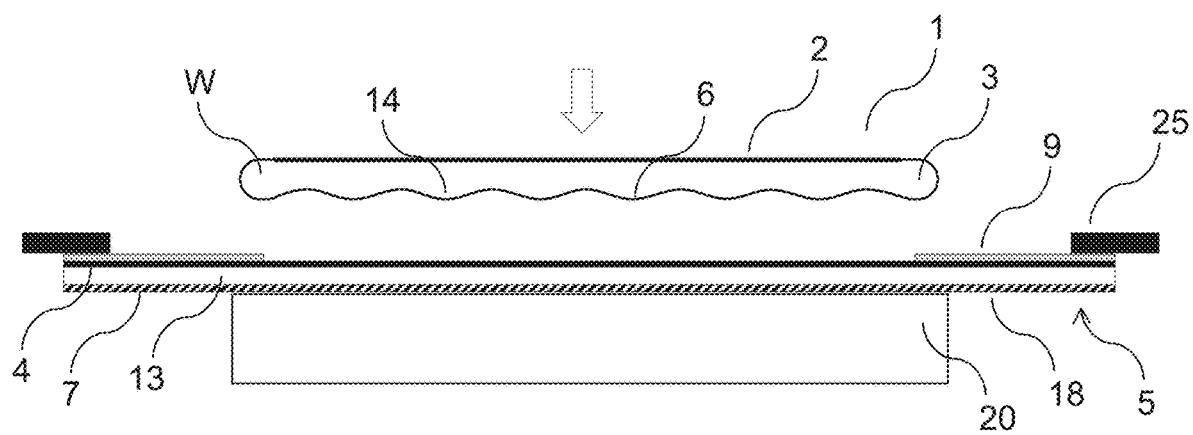
FIG. 4 is a cross-sectional view illustrating a step of attaching the protective sheeting shown in FIG. 3 to a wafer in a method of processing the wafer according to an embodiment of the present invention.

FIG. 4 illustrates a step of attaching the front surface of the protective film 4 to the second side 6 of the wafer W.

As is shown in FIG. 4, the annular adhesive layer 9 has an outer diameter which is larger than the inner diameter of an annular frame 25. Further, the annular adhesive layer 9 has an inner diameter which is smaller than the outer diameter of the wafer W but larger than the outer diameter of the device area 2. Hence, it can be reliably ensured that the adhesive of the adhesive layer 9 comes into contact only with the peripheral portion of the second side 6 of the wafer W, which corresponds to the peripheral marginal area 3 on the pattern side 1 of the wafer W.

Figure 6:
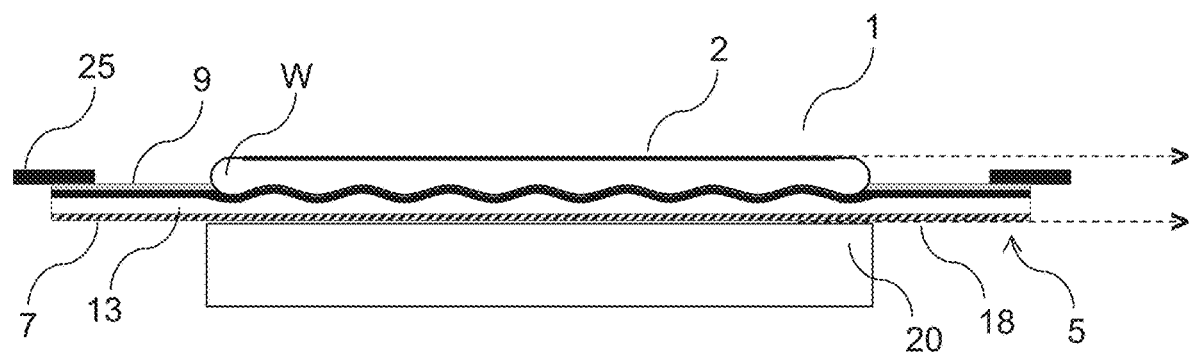
FIG. 6 is a cross-sectional view showing the outcome of the attachment step illustrated in FIG. 4.

Before attaching the protective sheeting 5 to the wafer W, a peripheral portion of the protective sheeting 5 is mounted on the annular frame 25. Further, a back surface 18 of the base sheet 7 opposite to the front surface 17 thereof is placed on a chuck table 20. Subsequently, as is indicated by an arrow in FIG. 4, the wafer W is attached to the protective sheeting 5 placed on the chuck table 20, thereby attaching the front surface of the protective film 4 to the second side 6 of the wafer W and adhering the protective film 4 to the peripheral portion of the second side 6 by the adhesive layer 9. Further, the protrusions 14 protruding on the second side 6 of the wafer W are embedded in the cushioning layer 13, as is schematically shown in FIG. 6.

The protective film 4 covers the protrusions 14, thus protecting them against damage or contamination. Further, the protective film 4 acts as an additional cushion or buffer in a subsequent cutting step, as will be detailed later.

The adhesive forming the adhesive layer 9 may be curable by an external stimulus, such as heat, UV radiation, an electric field and/or a chemical agent. In this way, the protective sheeting 5 can be particularly easily removed from the wafer W after processing.

In particular, the adhesive may be an acrylic resin or an epoxy resin. A preferred example of a UV curable-type resin for the adhesive is, e.g., urethane acrylate oligomer.

Further, the adhesive may be, for example, a water soluble resin.

For example, the protective film 4 may be made of a polymer material, such as PVC, EVA or polyolefin.

The protective film 4 is pliable and extendable to approximately three times its original diameter.

When attaching the wafer W to the protective sheeting 5, the protective film 4 is expanded, e.g., to approximately three times its original diameter, so as to closely follow the contours of the protrusions 14, as is schematically shown in FIG. 6.

The back surface 18 of the base sheet 7 is substantially parallel to the pattern side 1 of the wafer W, i.e., the first side thereof, as is indicated by dashed arrows in FIG. 6.

Specifically, the wafer W and the protective sheeting 5 are pressed together by applying a parallel pressing force to the pattern side 1 and the back surface 18 of the base sheet 7, for example, in a mounting chamber (not shown), so as to reliably embed the protrusions 14 in the cushioning layer 13 and achieve the substantially parallel alignment of base sheet back surface 18 and first wafer side 1. Details of pressing equipment and pressing operations suitable for this purpose are described in JP 5320058 B2 and JP 5324212 B2 for the case of using ResiFlat by the DISCO Corporation as a resin cushioning layer.

Figure 7:
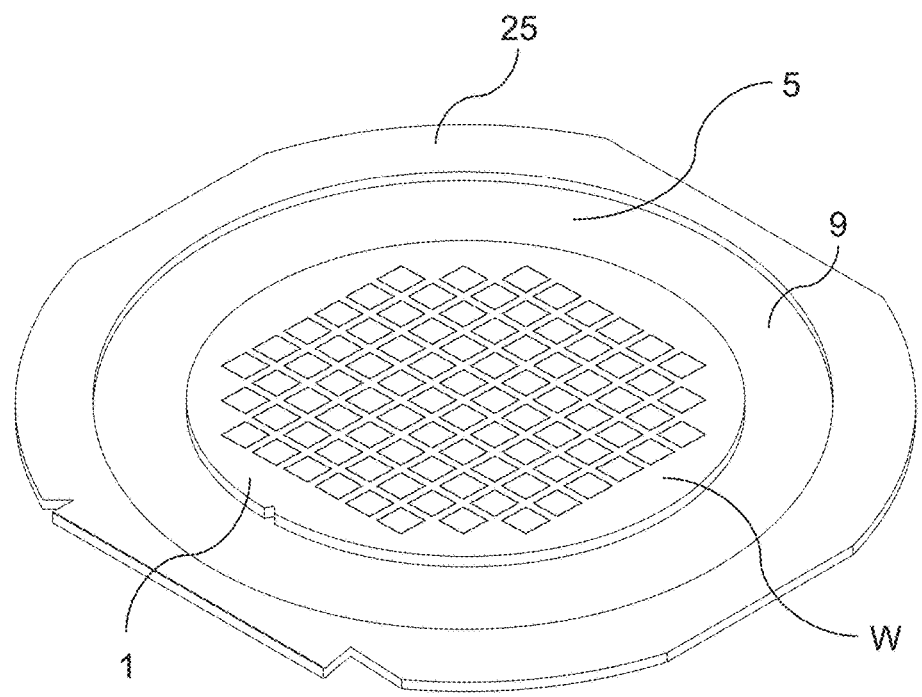
FIG. 7 is a perspective view of the arrangement of the wafer and the protective sheeting shown in FIG. 6.

By attaching the wafer W to the protective sheeting 5 in the manner described above, a wafer unit consisting of the wafer W, the protective film 4, the cushioning layer 13 and the base sheet 7 is formed, as is shown in FIGS. 6 and 7.

Figure 5:
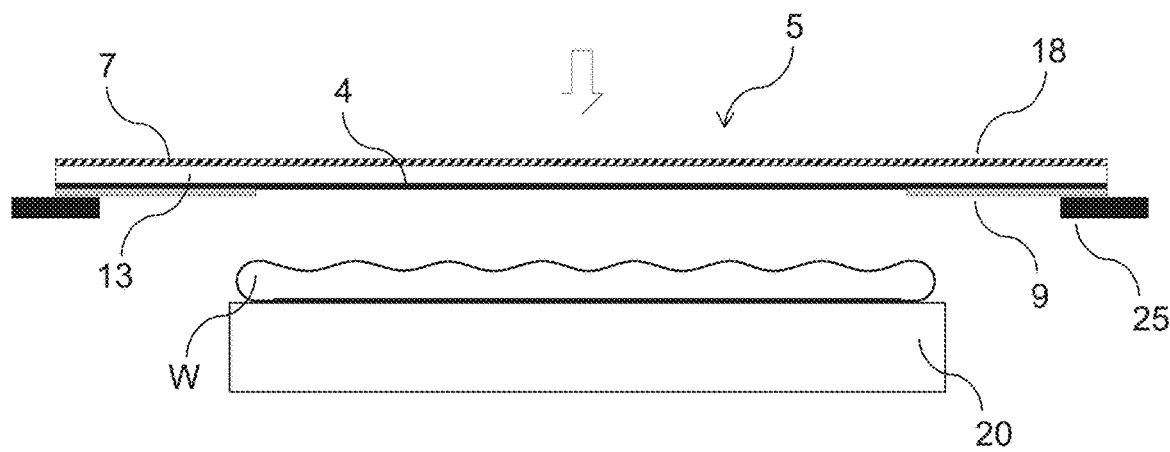
FIG. 5 is a cross-sectional view illustrating a step of attaching the protective sheeting shown in FIG. 3 to a wafer in a method of processing the wafer according to another embodiment of the present invention.

An alternative approach of attaching the wafer W to the protective sheeting 5 is illustrated in FIG. 5.

Specifically, as is shown in this figure, the pattern side 1 of the wafer W may be placed on the chuck table 20 so that the second side 6 is oriented upwards. Subsequently, the protective sheeting 5 may be attached to the second side 6 of the wafer W held on the chuck table 20, as is indicated by an arrow in FIG. 5, so that the protrusions 14 are embedded in the cushioning layer 13 and the back surface 18 of the base sheet 7 is substantially parallel to the pattern side 1 of the wafer W. This alternative step of attaching the wafer W and the protective sheeting 5 to each other can be carried out, for example, in a vacuum mounter, such as a vacuum chamber, e.g., the vacuum chamber described above.

After attaching the wafer W and the protective sheeting 5 to each other, the external stimulus is applied to the cushioning layer 13 so as to cure the cushioning layer 13. For example, for the case of a heat curable, e.g., thermosetting, cushioning layer 13, the cushioning layer 13 may be cured by heating in an oven. For the case of a UV curable cushioning layer 13, the cushioning layer 13 is cured by the application of UV radiation, e.g., through the base sheet 7, if a base sheet material is used which is transparent to this type of radiation, such as PET or glass.

Hence, the protrusions 14 are firmly held in the cured cushioning layer 13 and the substantially parallel relative alignment of the base sheet back surface 18 and the pattern side 1 is particularly reliably maintained throughout the further processing.

It is to be noted, however, that the step of curing the cushioning layer 13 described above is optional. Alternatively, the cushioning layer 13 may be formed of a non-curable material, such as a non-curable adhesive, a non-curable resin or a non-curable gel, or the cushioning layer 13 may be formed of a curable material but not be cured in the method of processing the wafer W.

Subsequently, after the optional step of curing the cushioning layer 13, the pattern side 1 of the wafer W is processed in the state, in which the back surface 18 of the base sheet 7, which is a plane, flat surface, is placed on the top surface of the chuck table 20 (see FIG. 6). In particular, the processing step may comprise or consist of a step of cutting the pattern side 1 of the wafer W, e.g., cutting the wafer W along the division lines 11. In this way, the wafer W can be divided into individual chips or dies 26 (see FIG. 2).

Figure 8:
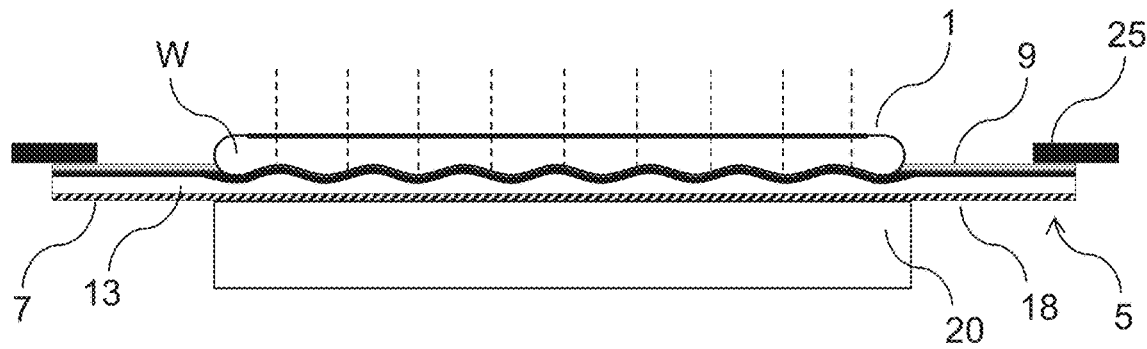
FIG. 8 is a cross-sectional view illustrating a cutting step performed on the wafer shown in FIGS. 6 and 7.

The step of cutting the wafer W along the division lines 11 is indicated by dashed lines in FIG. 8. As is illustrated in this drawing, in the present embodiment, the wafer W is cut from the pattern side 1 thereof. The cutting of the wafer W may be performed by mechanical cutting, e.g., by blade dicing or sawing, and/or by laser cutting and/or by plasma cutting. For example, laser cutting may be carried out by laser ablation or by forming modified layers inside the wafer W along the division lines 11 by laser irradiation. The wafer W may be cut in a single mechanical cutting step, a single laser cutting step or a single plasma cutting step. Alternatively, the wafer W may be cut by a sequence of mechanical cutting and/or laser cutting and/or plasma cutting steps. Moreover, the cutting process may be carried using a sequence of cutting steps with first and second cutting widths, as has been detailed above.

Since the plane back surface 18 of the base sheet 7, which is placed on the top surface of the chuck table 20, which may form part of a cutting apparatus (not shown), is substantially parallel to the pattern side 1 of the wafer W, the pressure applied to the wafer W, e.g., by a cutting blade or saw, during the cutting process is evenly and homogenously distributed over the wafer W. Hence, any risk of breakage of the wafer W can be minimised. Further, the substantially parallel alignment of the flat, even back surface 18 of the base sheet 7 and the pattern side 1 of the wafer W allows for the cutting step to be carried out with a high degree of precision, thus achieving particularly well-defined and uniform shapes and sizes of the resulting chips or dies 26.

The protective film 4 covers the protrusions 14 formed on the second side 6 of the wafer W, therefore protecting the protrusions 14 from damage and contamination, e.g., by residues of the material forming the cushioning layer 13. Moreover, the protective film 4 functions as an additional cushion or buffer between the second side 6 of the wafer W and the cushioning layer 13, thus further contributing to the uniform and homogeneous distribution of pressure during processing, such as cutting. Therefore, breakage of the wafer W during the cutting process can be particularly reliably prevented.

Figure 9:
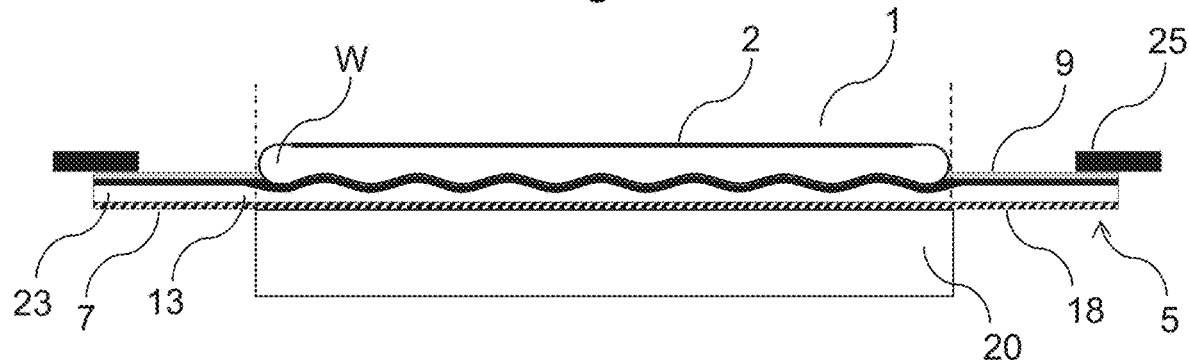
FIG. 9 is a cross-sectional view illustrating a step of cutting off a laterally extending portion of the protective sheeting shown in FIG. 6.
Figure 10:
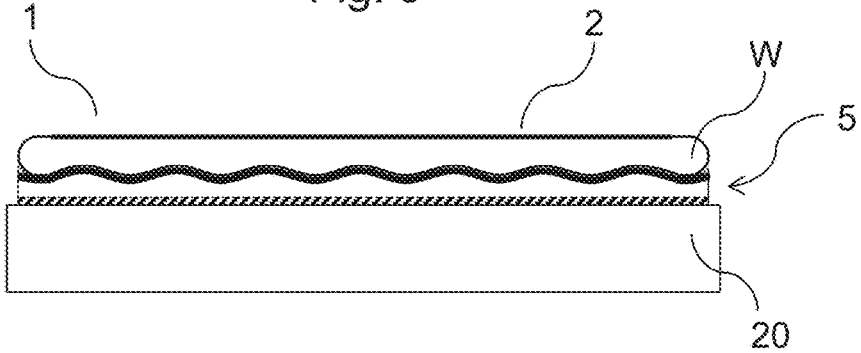
FIG. 10 is a cross-sectional view showing the outcome of the cutting step illustrated in FIG. 9.
Figure 11:
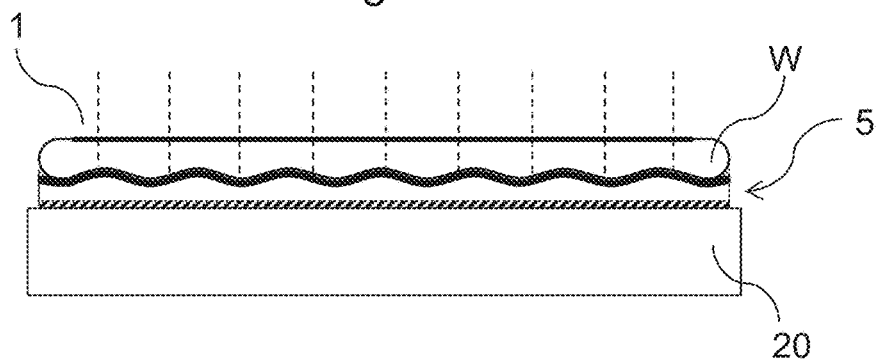
FIG. 11 is a cross-sectional view illustrating a cutting step performed on the wafer shown in FIG. 10.

Optionally, before processing, e.g., cutting, the first side 1 of the wafer W, a portion 23 of the protective sheeting 5 which laterally extends beyond the circumference of the wafer W can be cut off, as is schematically shown in FIGS. 9 to 11.

Specifically, the step of cutting off the laterally extending portion 23 is indicated by dashed lines in FIG. 9. The portion 23 may be cut off, for example, by mechanical cutting, e.g., using a blade or a saw, by laser cutting or by plasma cutting. Cutting off the portion 23 facilitates handling of the wafer unit in the subsequent processing steps. The outcome of this cutting step is schematically shown in FIG. 10.

After cutting off the portion 23, the pattern side 1 of the wafer W may be cut in the same manner as described above with reference to FIG. 8. Specifically, the pattern side 1 of the wafer W may be cut along the division lines 11, thereby dividing the wafer W into individual chips or dies 26. The step of cutting the wafer W along the division lines 11 is indicated by dashed lines in FIG. 11.

After the chips or dies 26 have been completely separated from one another in the cutting step, they may be picked up by a pick-up device (not shown).

Before carrying out this pick-up step, the base sheet 7 and the cushioning layer 13 may be removed from the divided wafer W together, so that the chips or dies 26 remain on the protective film 4. In this way, the separated dies or chips 26 can be picked up from the protective film 4 in a particularly simple and efficient manner. For example, the protective film 4 may be radially expanded, using an expansion drum or the like, thereby increasing a gap between adjacent chips or dies 26 and thus facilitating the pick-up process. In this case, it is preferable that the adhesive layer 9 be provided over an entire contact area of the second side 6 of the wafer W and the protective film 4.

The cushioning layer 13 may exhibit a degree of compressibility, elasticity and/or flexibility, e.g., a rubber-like behavior, after curing, thus allowing for a particularly easy removal thereof from the wafer W. Alternatively or additionally, another external stimulus, such as hot water, may be applied to the cured cushioning layer 13 prior to removal thereof, in order to soften the cured cushioning layer 13 for further facilitating the removal process.

If the adhesive layer 9 is curable by an external stimulus, such as UV radiation, heat, an electric field and/or a chemical agent, the external stimulus is applied to the adhesive layer 9, so as to lower the adhesive force thereof. In this way, the separated chips or dies 26 can be picked up from the protective film 4 in a particularly simple and reliable manner.

In the following, a method of processing a wafer W according to a second embodiment of the present invention will be described with reference to FIGS. 12 to 15.

The method of the second embodiment substantially differs from the method of the first embodiment in that no annular frame, such as the annular frame 25 shown in FIGS. 4 to 6, is used. The processing method of this second embodiment employs a protective sheeting 5' according to a second embodiment (see FIG. 12) which differs from the protective sheeting 5 according to the first embodiment in that it has a smaller outer diameter.

Specifically, as is schematically shown in FIG. 13, the outer diameter of the protective sheeting 5' is only slightly larger, e.g., by 0.5 to 2.0 mm, than the outer diameter of the wafer W.

Alternatively, the outer diameter of the protective sheeting 5' may be substantially the same as the outer diameter of the wafer W.

Otherwise, the processing steps shown in FIGS. 13 to 15 are substantially identical to those shown in FIGS. 6, 9 and 11, respectively.

Specifically, the wafer W is attached to the protective sheeting 5' first, so that the protective film 4 is adhered to the peripheral portion of the second wafer side 6, the protrusions 14 are embedded in the cushioning layer 13 and the back surface 18 of the base sheet 7 is substantially parallel to the pattern side 1 of the wafer W, as is indicated by dashed arrows in FIG. 13. This attachment may be achieved by pressing together the wafer W and the protective sheeting 5' by applying a parallel pressing force to the pattern side 1 and the back surface 18 of the base sheet 7, as has been detailed above. The back surface 18 is placed on the top surface of the chuck table 20 (see FIG. 13).

As an optional step, a portion 23 of the protective sheeting 5' laterally extending beyond the circumference of the wafer W may be cut off, before processing, e.g., cutting, the pattern side 1 of the wafer W. For example, the portion 23 may be cut off by mechanical cutting, e.g., using a blade or a saw, by laser cutting or by plasma cutting, as has been detailed above. The optional step of cutting off portion 23 is indicated by dashed lines in FIG. 14.

Subsequently, the pattern side 1 of the wafer W may be cut in the same manner as described above with reference to FIGS. 8 and 11. Specifically, the pattern side 1 of the wafer W may be cut along the division lines 11, thereby dividing the wafer W into individual chips or dies 26. The step of cutting the wafer W along the division lines 11 is indicated by dashed lines in FIG. 15.

After the chips or dies 26 have been completely separated from one another in the cutting step, they may be picked up by a pick-up device (not shown) in the same manner as detailed above.

The invention claimed is:

1. A method of processing a wafer, having a first side with a device area comprising a plurality of devices, and a second side being opposite to the first side, wherein the second side has a plurality of protrusions protruding along a thickness direction of the wafer and the method comprises:
    providing a protective film;
    providing a base sheet having a cushioning layer applied to a front surface thereof;
    attaching a front surface of the protective film to the second side of the wafer, wherein the protective film is directly adhered to at least a peripheral portion of the second side with an adhesive;
    attaching a back surface of the protective film opposite to the front surface thereof to the cushioning layer,
    embedding the protrusions protruding along the thickness direction of the wafer in the cushioning layer so that a back surface of the base sheet opposite to the front surface thereof is substantially parallel to the first side of the wafer; and
    processing the first side of the wafer.

2. The method according to claim 1, wherein
    the protective film and the base sheet, having the cushioning layer applied to the front surface thereof are laminated first, forming a protective sheeting comprising the base sheet, the cushioning layer and the protective film attached to the cushioning layer, and
    the protective sheeting is subsequently attached to the second side of the wafer, such that the protrusions protruding along the thickness direction of the wafer are covered by the protective film and embedded in the cushioning layer, and the back surface of the base sheet is substantially parallel to the first side of the wafer.

3. The method according to claim 1, wherein
    the protective film is attached to the second side of the wafer first, and
    the second side of the wafer, having the protective film attached thereto, is subsequently attached to the front surface of the base sheet, so that the protrusions protruding along the thickness direction of the wafer are embedded in the cushioning layer and the back surface of the base sheet is substantially parallel to the first side of the wafer.

4. The method according to claim 1, wherein the device area is partitioned by a plurality of division lines, and the step of processing the first side of the wafer comprises cutting the wafer along the division lines.

5. The method according to claim 1, further comprising removing the protective film, the cushioning layer and the base sheet from the wafer.

6. The method according to claim 5, wherein the cushioning layer and the base sheet are removed from the wafer first, before removing the protective film from the wafer.

7. The method according to claim 1, wherein the adhesive for adhering the protective film to the second side of the wafer is provided only in the peripheral portion of the second side of the wafer or the adhesive is provided over an entire contact area of the second side of the wafer and the protective film.

8. The method according to claim 1, wherein the protective film is expandable and the protective film is expanded when it is attached to the second side of the wafer, so as to follow the contours of the protrusions protruding along the thickness direction of the wafer.

9. The method according to claim 1, wherein the cushioning layer is curable by an external stimulus, such as UV radiation, heat, an electric field and/or a chemical agent.

10. The method according to claim 9, further comprising applying the external stimulus to the cushioning layer so as to cure the cushioning layer, before processing the first side of the wafer.

11. The method according to claim 1, further comprising cutting off a portion or portions of the protective film and/or the cushioning layer and/or the base sheet which laterally extends or extend beyond a circumference of the wafer, before processing the first side of the wafer.

12. The method according to claim 1, wherein the base sheet is made of a rigid material, such as PET and/or silicon and/or glass and/or SUS.

13. The method according to claim 1, wherein the protective film has a thickness in the range of 5 to 200 μm.

14. The method according to claim 1, wherein the cushioning layer has a thickness in the range of 10 to 300 μm.

* * * * *